United States Patent [19]

Brinkman et al.

[11] 3,721,975

[45] March 20, 1973

[54] HIGH SPEED ANALOG-TO-DIGITAL CONVERTER

[75] Inventors: John D. Brinkman, Pine Brook; Ronald Y. Paradise, Hillsdale; Robert S. Prill, Parsippany, all of N.J.

[73] Assignee: The Singer Company, Little Falls, N.J.

[22] Filed: Oct. 7, 1971

[21] Appl. No.: 187,247

[52] U.S. Cl. ..........340/347 AD

[51] Int. Cl. ..........H03k 13/02

[58] Field of Search ..........340/347 AD

[56] References Cited

UNITED STATES PATENTS

| | | | |
|---|---|---|---|
| 3,467,958 | 9/1969 | McKinney | 340/347 AD |
| 3,585,631 | 6/1971 | McCowan | 340/347 AD |
| 3,425,054 | 1/1969 | Cowan | 340/347 AD |
| 3,501,625 | 3/1970 | Gorbatenko | 340/347 AD |

*Primary Examiner*—Maynard R. Wilbur
*Assistant Examiner*—Jeremiah Glassman
*Attorney*—S. A. Giarratana

[57] ABSTRACT

An analog-to-digital converter is provided which is capable of high speed operation in the nanosecond range. The analog input is introduced to an N-bit analog/digital converter; and the resulting digital output is passed to a digital/analog converter, the output of which appears across a current summing resistor stage. The aforesaid components make up a universal stage which can be cascaded with other similar stages through appropriate scaling amplifiers to provide a high resolution high speed analog-to-digital converter. The aforesaid universal stage uses a "thermometer" code in its analog/digital and digital/analog converters, such that each leg of the digital/analog converter has a weight of one count only. This is in contradistinction to the binary code in which each higher order bit has a weight of twice the number of counts, as compared with the previous bit. The use of the "thermometer" code allows the scaling amplifier to settle faster than it would if a binary code were used, since it is not subjected to large transient voltages which tend to drive the amplifier to saturation and beyond its cut off point.

6 Claims, 7 Drawing Figures

(3-Bit Parallel A/D Converter and Thermometer Decode Logic)

(A/D Converters Reference Source)

HIGH SPEED ANALOG-TO-DIGITAL CONVERTER

BACKGROUND OF THE INVENTION

Existing systems for analog/digital conversion, such as those using the successive approximation and feed-forward techniques, do not have an inherent high speed conversion capability. Such analog/digital converter systems of the "feed-forward" type are described, for example, in U.S. Pat. No. 3,581,304 which issued May 25, 1971, and in U.S. Pat. No. 3,541,315 which issued Nov. 17, 1970, both patents being assigned to the present assignee. The feed-forward converters described in the aforesaid patents require a difference amplifier which must "settle" a multiplicity of times for each conversion, and which must be capable of accepting large over-drive voltages with an attendant recovery delay. This latter characteristic, because of limitations imposed by present-day state of the art components, tends to increase the overall conversion time of the prior art converter. The analog/digital converter system of the present invention utilizes what has been termed a "thermometer" code as described briefly above, so that its scaling amplifier is not subjected to excessive over-drive voltages, and it is not subject to the timing limitations of the prior art systems. For example, a constructed embodiment of the invention exhibits a conversion time of the order of 50 nanoseconds.

Figure 1:
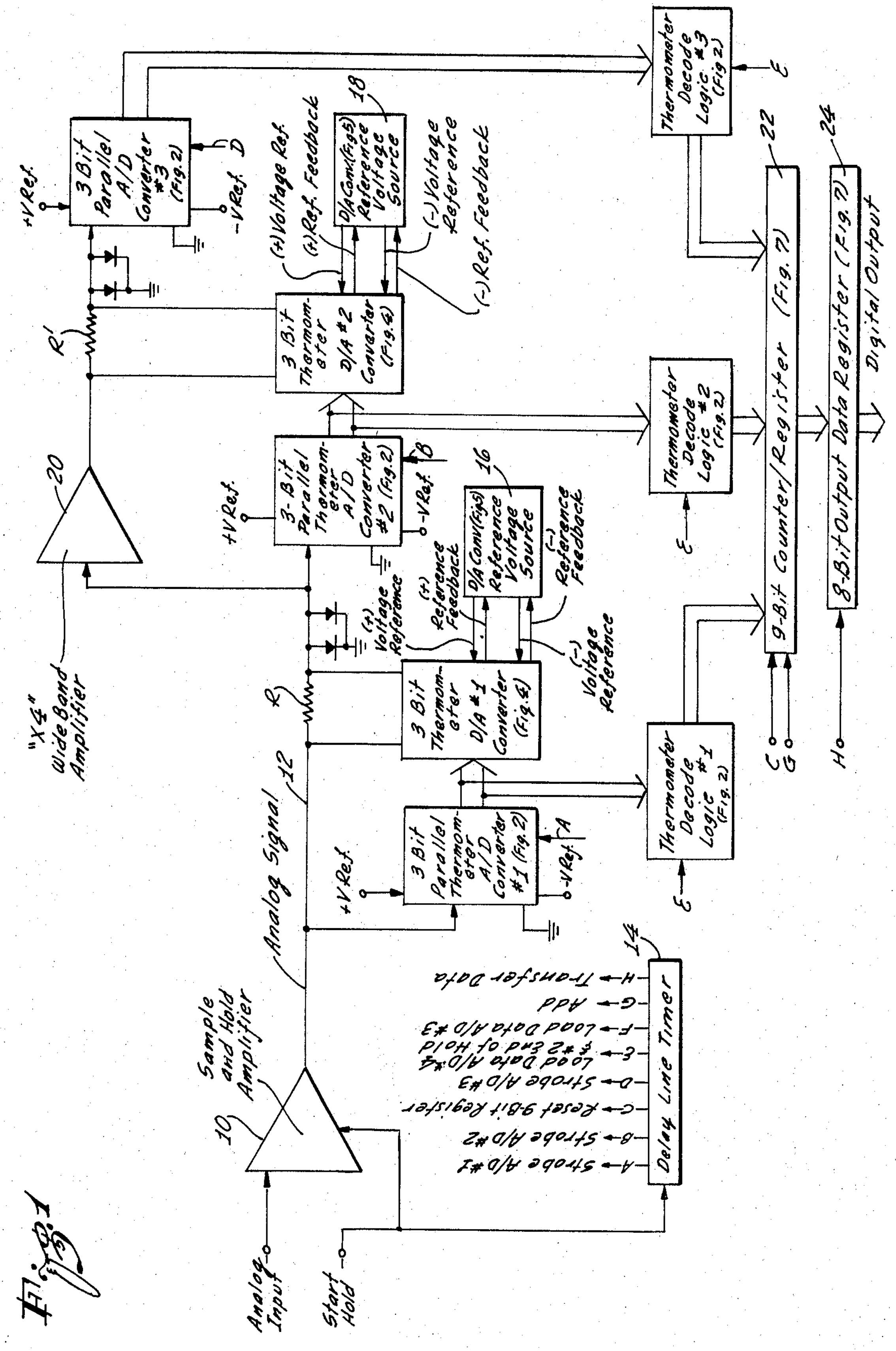
FIG. 1 is a block diagram of an analog-to-digital conversion system incorporating the concepts and principles of the present invention.

It will become evident as the description proceeds that the components shown in block form in the system of FIG. 1, other than those shown in circuit detail in FIGS. 2–7, are well known to the electronic art, and a detailed description of the circuitry involved in such components is believed to be unnecessary for a full and complete understanding of the system of the present invention.

DETAILED DESCRIPTION OF THE ILLUSTRATED EMBODIMENT

With reference to the system shown in FIG. 1, it will be observed that the analog input to be converted to a digital output is applied to a "sample and hold" amplifier 10. The amplifier 10 responds to a "start hold" command to maintain a constant analog output level on lead 12 until an "end hold" 3E "applied to the amplifier. The "start hold" command is also applied to a delay line timer 14, and the delay line timer produces successive outputs A through H, each with a predetermined time delay with respect to the "start hold" command.

Figure 2:
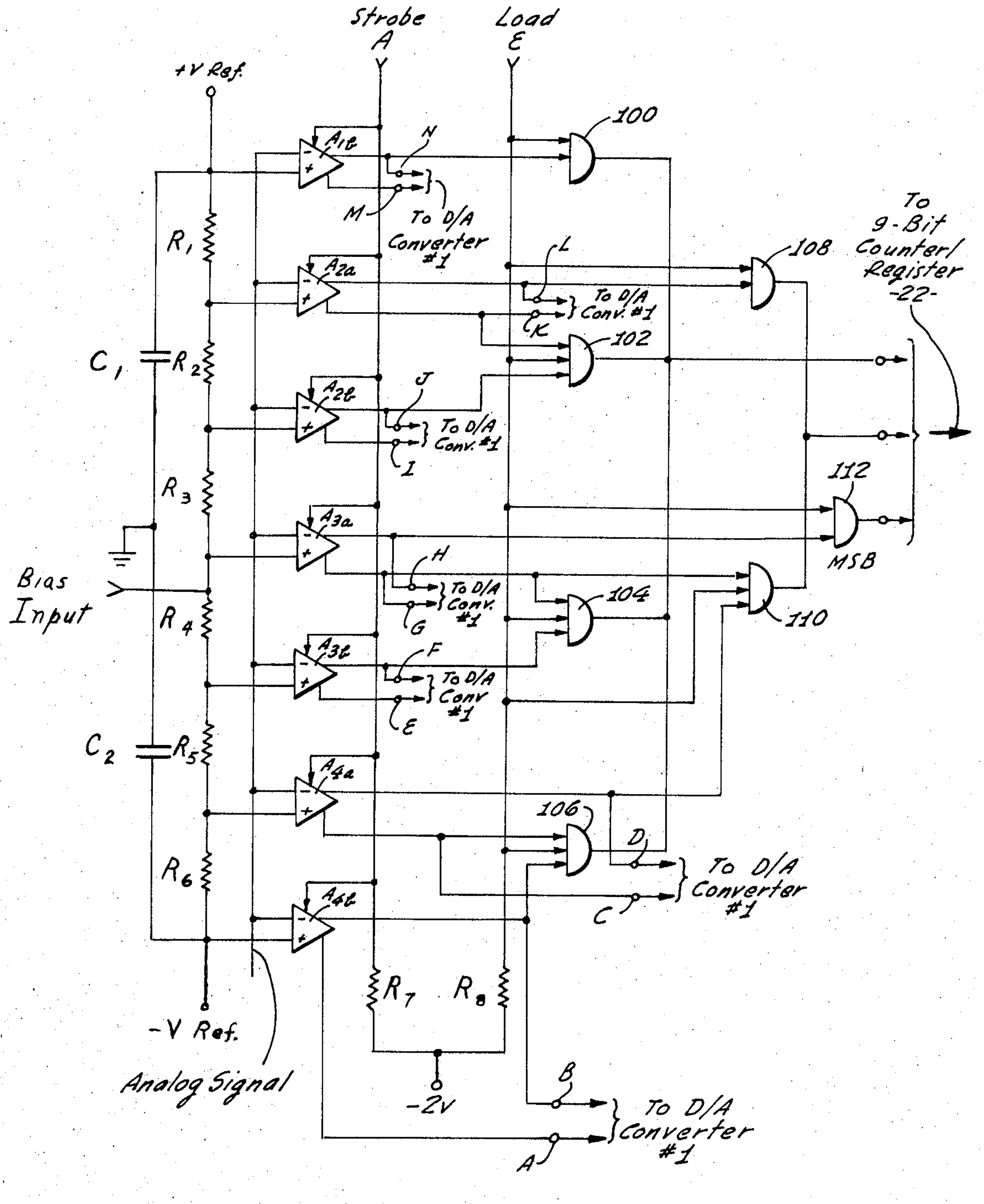
FIG. 2 is a logic circuit diagram of a 3-bit parallel thermometer analog/digital converter and associated thermometer decode logic circuitry which is incorporated into the system of FIG. 1.

The lead 12 is connected to the input of a 3-bit parallel "thermometer" analog/digital converted No. 1, the circuit details of which are described in FIG. 2. The converter No. 1 is strobed by the output A from the delay line timer 14. The resulting 3-bits from the converter No. 1 are applied to a 3--bit 3thermometer" digital/analog converter No. 1, the circuit details of which are described in FIG. 4. The output from the analog/digital converter No. 1 is also applied to a thermometer decode logic circuit No. 1, which is described in circuit detail in FIG. 2. The decode logic circuit No. 1 serves to convert the thermometer code to the usual binary code. The "thermometer" digital/analog converter No. 1 receives its reference voltage from a reference source 16, the reference source being described in greater detail in conjunction with FIG. 5. It should be explained that the term "thermometer" as applied to the analog/digital converters means that each bit of the digital output from the converters, unlike the usual binary code, has equal weight. Likewise, the term "thermometer" as applied to the digital/analog converters means that each leg of the digital/analog converter has a weight of one count only.

The output from the 3-bit thermometer digital/analog converter No. 1 appears across a summing resistor R in the lead 12. The summing resistor is connected to the input of a 3-bit parallel analog/digital converter No. 2 which may be similar in its construction to the analog/digital converter No. 1 referred to above. The output from the analog/digital converter No. 2 is applied to a 3-bit thermometer digital/analog converter No. 2 which may be similar to the thermometer digital/analog converter No. 1 referred to above. The digital/analog converter No. 2 is excited from a reference voltage source 18 which may be similar to the source 16. The output of the digital/analog converter No. 2 appears across a summing resistor R'. The resistor R' is connected to the input of a "times four" wide-band scaling amplifier 20, and to the input of a 3-bit parallel thermometer analog/digital converter No. 3. The analog/digital converter No. 3 may be similar to the corresponding analog/digital converters No. 1 and No. 2.

The output of the analog/digital converter No. 2 is applied to a thermometer decode logic circuit No. 2 which may be similar to the decode logic circuit No. 3. Likewise, the output from the analog/digital converter No. 3 is applied to a thermometer decode logic circuit No. 3 which may be similar to the decode logic circuits No. 1 and No. 2.

The analog/digital converter No. 2 is strobed by the output B of the delay line timer 14, and the analog/digital converter No. 3 is strobed by the output D. The decode logic circuits No. 1, No. 2 and No. 3 load the outputs from the analog/digital converters No. 1, No. 2 and No. 3 into a 9-bit counter/register 22. The decode logic circuits No. 1 and No. 2 are activated by the output E from the delay line timer 14 so that they each load 3 bits into the conter/register 22 at that time, and the decode logic circuit No. 3 is activated by the output F from the timer, so that it then loads its 3 bits into the 9-bit counter/register 22. The counter/register 22 is reset by the timing signal C from the delay line timer 14. The timing signal G from the timer 14 sets the counter/register 22 to its "add" mode. The output from the counter/register 22 is applied to an 8-bit output data register 24, upon a data transfer mode, which is set by the command H from the timer 14. The registers 22 and 24 are described in more detail in FIG. 7.

The analog input voltage is applied to the converter from the sample and hold amplifier 10, or equivalent low source impedance amplifier. This voltage is applied directly to the 3-bit analog-to-digital converter No. 1 and to the summing resistor R. The analog-to-digital converter No. 1, as will be described in FIG. 2, contains seven comparators, and it digitizes the analog input to one of eight counts, such that the outputs of the comparators can be used to encode a 3-bit output and simultaneously drive seven digital/analog current switches in the associated thermometer digital/analog converter No. 1. The outputs of the current switches are applied to the summing resister R in such a way as to subtract an analog voltage proportional to the digitized output of the analog/digital converter No. 1.

The analog/digital converter No. 1 and associated digital/analog converter No. 1 use a thermometer code, as explained above, such that each leg of the digital/analog converter has the weight of one count only. As also previously explained, this is in contradistinction to the binary code in which each higher order bit has a weight of twice the number of counts compared with the previous bit. The use of the thermometer code allows the scaling amplifier 20 to settle faster than in the equivalent binary code type circuitry. This is because the amplifier is not subjected to large transient voltages as it would be if a binary code were used, and which would tend to drive it into saturation and beyond its cutoff point.

The illustrated system of FIG. 1 is an 8-bit system, and for that purpose, the resulting voltage at the output end of the summing resistor R is applied to the second 3-bit parallel analog/digital converter No. 2, and also to the scaling amplifier 20. The scaling amplifier multiplies the magnitude of the voltage across the resistor R by a factor of four, in the illustrated embodiment. The analog/digital converter No. 2 operates in the same manner as the analog/digital converter No. 1, and it also drives the digital/analog converter No. 2 in the same manner so as to substract a discrete voltage, proportional to the encoded output of the analog/digital converter No. 2, from the output of the scaling amplifier 20. This latter operation is performed across the summing resistor R'.

In the last step of the analog/digital conversion in the illustrated system of FIG. 1, a third 3-bit analog conversion is made on the voltage remaining from the output of the scaling amplifier 20 minus the output of the digital/analog converter No. 2, this being achieved by the analog/digital converter No. 3. The outputs of the three analog/digital converters No. 1, No. 2 and No. 3 are combined into a single 8-bit output by means of the 9-bit counter register 22. As described above, the outputs of the three analog/digital converters are applied to the 9-bit counter/register 22 through thermometer-binary decode logic circuits No. 1, No. 2 and No. 3. The output data is made available by storing the results in the 8-bit output data register 24.

It will be appreciated that the system of FIG. 1, in addition to its high speed conversion capabilities, is economically feasible to construct, in that it makes use of a plurality of universal N bit analog/digital converter, digital/analog converter and current summing resistor stages. Each one of the universal stages can be cascaded with other similar stages, as described in conjunction with FIG. 1, so as to provide a high resolution analog/digital converter. In the specific configuration of FIG. 1, three 3-bit conversions are cascaded in order to obtain an 8-bit output. The high speed is achieved by the use of a parallel thermometer code analog/digital converter and thermometer type digital/analog converter in each of the first two of the 3-bit conversions, and the desired results are achieved by the use of the scaling amplifier 20 in the manner described.

The 3-bit parallel thermometer code analog/digital converter and associated thermometer decode logic circuit is shown in the schematic logic diagram of FIG. 2. The circuitry of FIG. 2 is appropriate for any one of the three bit parallel analog/digital converter stages, and for any one of the thermometer decode logic stages of FIG. 1.

In the circuit of FIG. 2, the analog signal input from amplifier 10, for example, received over the lead 12, is applied to the common junction of all seven comparators. The resistor chain consisting of R1, R2, R3, R4, R5, and R6 are connected across a reference voltage source designated $+V_{ref}$, $-V_{ref}$. Each of these resistors may have a value of 49.9 ohns. The resistors are shunted by a pair of capacitors C1 and C2, each of which has a capacity of 0.1 microfarads. The common junction of the capacitors C1 and C2 is grounded. The junctions of the various resistors R1 through R6 are connected to the positive inputs of a series of comparators A1*b*, A2*a*, A2*b*, A3*a*, A3*b*, A4*a*, and A4*b*.

The individual comparators are strobed by the timing signal A from the delay line timer 14, as described above. The signal A is applied to a common connection which is connected to a 50 ohm resistor R7, the other terminal of which is connected to a negative 2-volt voltage source. The outputs of the amplifiers are connected to a series of "and" gates designated 100,102, 104, 106, 108, 110 and 112. These gates form the thermometer decode logic circuit No. 1 (FIG. 1) and they serve to introduce the corresponding three bits into the 9-bit counter-register 22 when they are enabled by the load command "E" from the timer 14.

The outputs from the comparators are also applied to the digital/analog converter No. 1 by way of terminals A-N. The load command "E" is applied to a lead extending to all the gates, and which is connected to a resistor R8, the other terminal of which is connected to the negative 2-volt source.

The circuitry of FIG. 2 may be obtained as a standard integrated circuit package, for example, from the Motorola Company of Phoenix, Ariz. The thermometer decode logic circuit compresses the seven comparator outputs into three binary equivalent outputs all of equal weight.

Figure 3:
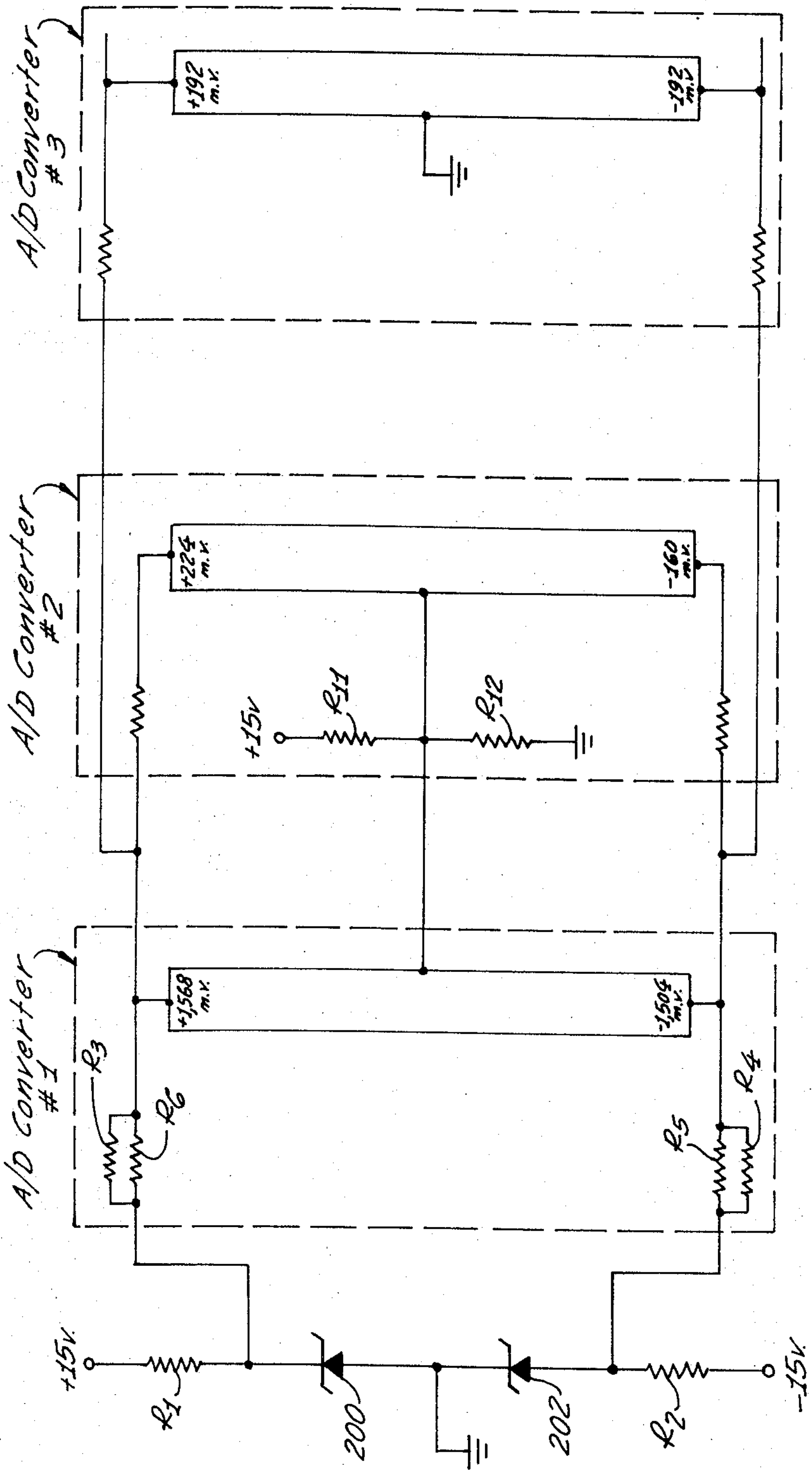
FIG. 3 is a circuit schematic diagram of a reference voltage source for the analog/digital converters used in the system of FIG. 1.

The circuit of FIG. 3 supplies the reference voltages for the 3-bit parallel analog/digital converters. The circuit of FIG. 3 includes, for example, a resistor R1 connected to the positive terminal of a 15-volt unidirectional source and having, for example, a resistance of 432 ohms. The resistor R1 is connected to the cathode of a Zener diode 200, the anode of which is grounded. A resistor R2 of the same value as the resistor R1 is connected to the negative terminal of the 15-volt source, and to the anode of a Zener diode 202. The cathode of the latter Zener diode is grounded. The resistor R1 is also connected through a 402 ohm resistor R6 to the circuitry of the analog/digital converter No. 1, the resistor R6 being shunted by a trimming resistor R3.

Likewise the resistor R2 is connected to the circuitry of the analog/digital converter No. 1 through a 402 ohm resistor R5, the resistor R5 being shunted by a trimming resistor R4. The source provides, for example, +1.568 volts and −1.504 volts to the circuit of the analog/digital converter No. 1. The resistor R6 is connected to a 1.05 kilo-ohm resistor R7 in the analog/digital converter No. 2, and the resistor R5 is connected to a 1.05 kilo-ohm resistor R8 in the analog/digital converter No. 2. The intermediate points of the circuits of the analog/digital converter No. 1 and No. 2 are also connected to the common junction of a pair of resistors R11 and R12. The resistor R11 has a value of 4.7 kilo-ohms, and the resistor R12 has a value of 10 ohms. These resistors are connected between the positive terminal of the 15-volt source and ground. The reference source provides, for example, +224 millivolts and −160 millivolts for the analog/digital converter No. 2.

The resistor R6 is also connected to a resistor R9, and the resistor R5 is connected to a resistor R10, in the analog/digital converter No. 3. The resistor R9 may have a value of 1.07 kilo-ohms, and the resistor R10 may have a value of 1.02 kilo-ohms. The source provides, for example, +192 millivolts and −192 millivolts to the circuit of the analog/digital converter No. 3. The intermediate point of the circuit of the analog/digital converter No. 3 is grounded.

Figure 4:
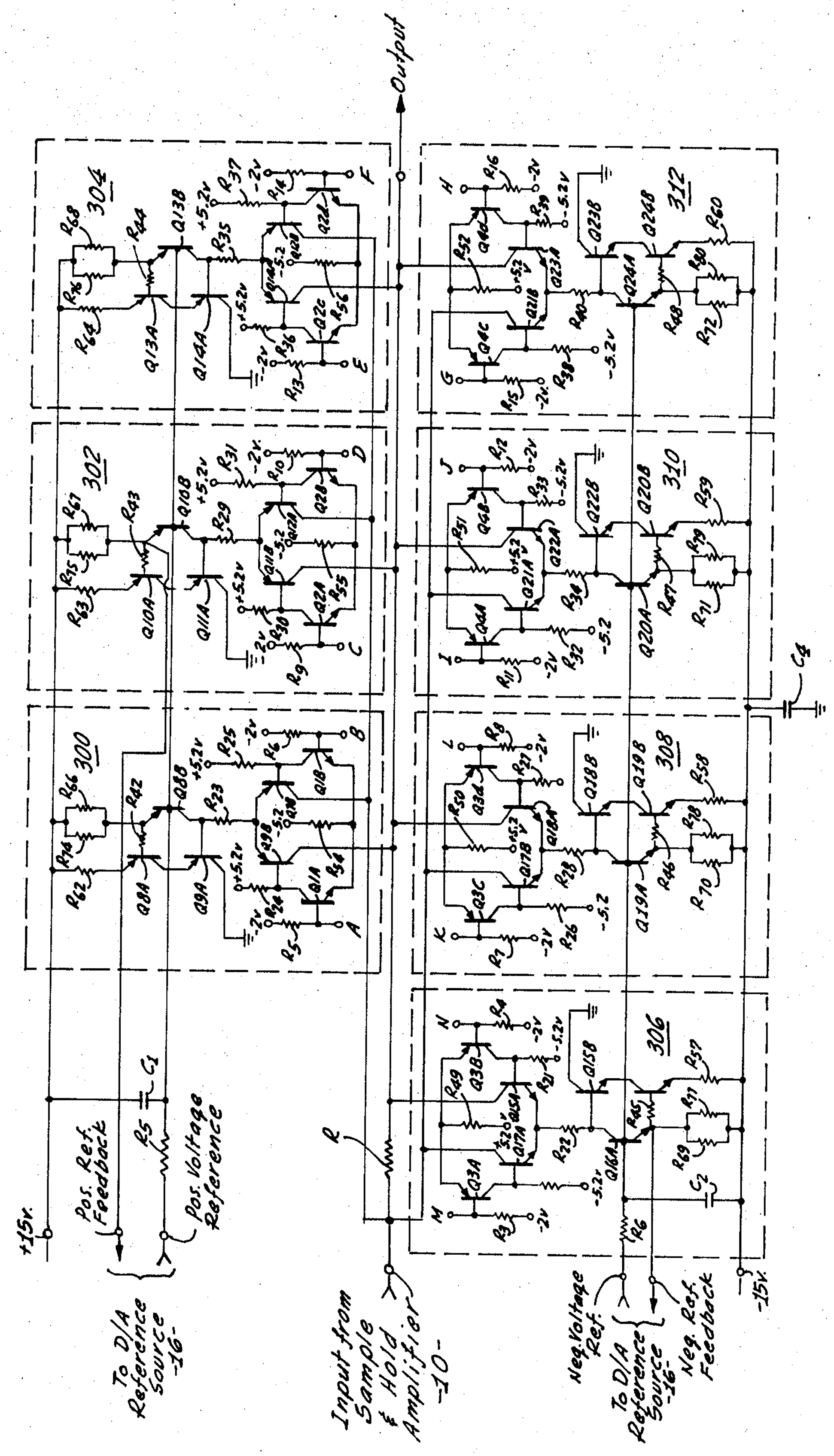
FIG. 4 is a circuit diagram of a 3-bit digital/analog converter which is incorporated in the system of FIG. 1.

The circuitry of FIG. 4 is appropriate for any one of the 3-bit thermometer digital/analog converters of the system of FIG. 1. The converter of FIG. 4 is made up of a series of differential switches designated 300, 302, 304, 306, 308, 310 and 312 respectively. These switches are activated by the outputs of the respective comparators A1*b*, A2*a*, A2*b*, A3*a*, A3*b*, A4*a*, A4*b* in the analog/digital converter of FIG. 2 by way of terminals A-B, C-D, E-F, G-H, I-J, K-L, M-N. Each of the differential switches is made up of appropriate transistor circuitry connected as shown.

Figures 5, 6:
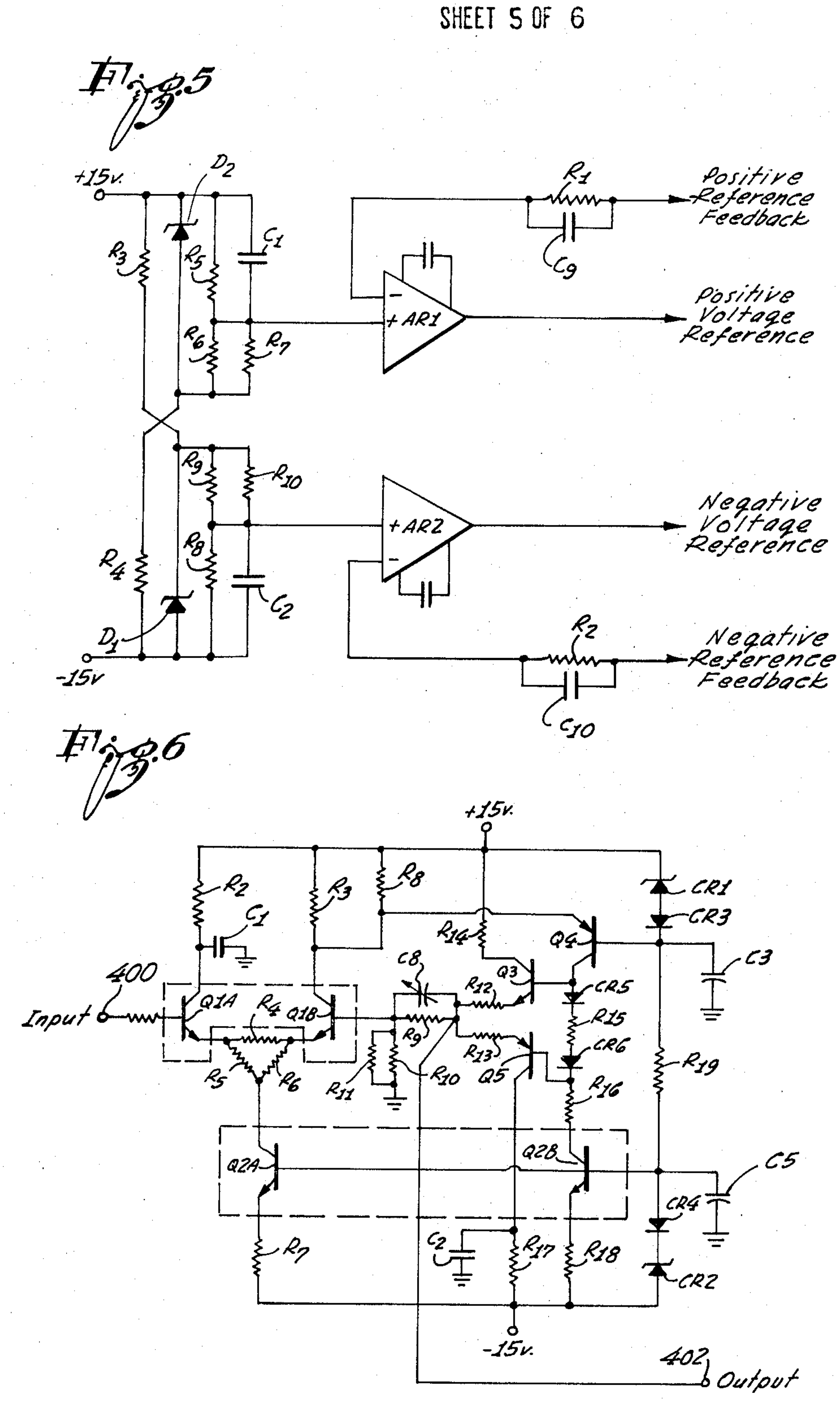
FIG. 5 is a schematic circuit diagram of a reference voltage source for the digital/analog converter of FIG. 4.
FIG. 6 is a circuit diagram of a wide-band scaling amplifier which also is used in the system of FIG. 1.

The switches 300, 302 and 304 are energized by a positive voltage reference derived, for example, from the circuit of FIG. 5; and the switches 306, 308, 310 and 312 are activated by a negative voltage reference likewise derived from the circuit of FIG. 5, the circuit of FIG. 5 being represented by the block 16 in FIG. 1. The summing resistor R is connected to the various switches, as shown. Positive reference feedback is provided for the source 16 from the switch 300, and negative reference feedback is provided by the switch 306. Feedback is provided only from the switches 300 and 306 because statistically they will be on the greatest amount of time, since they are connected to the comparators which sense voltage levels in the vicinity of zero volts.

The reference source 16 is shown in circuit detail in FIG. 5, and the same circuit may be used for the reference source 18. The reference source includes, for example, a resistor R3 and a Zener diode D1 connected between the positive 15-volt terminal and the negative 15-volt terminal, and a Zener diode D2 and a resistor R4, likewise connected between the two terminals. The Zener diode D1 is shunted by a pair of resistors R8 and R9, and the Zener diode D2 is shunted by a pair of resistors R5 and R6.

The resistors R5 and R6 are shunted by a capacitor C1 and resistor R7, and the resistors R8 and R9 are shunted by a resistor R10 and capacitor C2. The common junctions of the resistors R5, R6 and capacitor C1 and resistor R7 are connected to the positive input of an operational amplifier AR1; and the common junction of the resistors R8, R9, and capacitor C2 and resistor R10, are connected to the positive terminal of an operational input amplifier AR2. The output of the amplifier AR1 provides the positive voltage reference for the digital/analog circuit, and the output of the amplifier AR2 provides the negative voltage reference.

The positive reference feedback is applied to the negative terminal of the amplifier AR1 through a resistor R1 which is shunted by a capacitor C9. The negative reference feedback is applied to the negative input of the amplifier AR2 through a resistor R2 which is shunted by a capacitor C10. The purpose of the reference source 16 is to set the current accurately in the current source for each switch in the digital/analog circuitry of FIG. 4.

The wide-band scaling amplifier 20, shown in FIG. 6 includes an input terminal 400 which is connected to the summing resistor R, as shown in FIG. 1. The input terminal 400 is connected through an 82 ohm resistor R1 to the base of an NPN transistor Q1A. The transistor Q1A and a further NPN transistor Q1B may be incorporated on an integrated circuit chip, of the type presently designated MD918AF. The emitters of the transistors Q1A and Q1B are connected together through a 10 ohm resistor R4, the resistor R4 being shunted by a pair of 180 ohm resistors R5 and R6. The junction of the resistors R5 and R6 is connected to the collector of an NPN transistor Q2A.

The transistor Q2A, and a further NPN transistor Q2B may be incorporated on an integrated circuit chip, as presently designated MD918F. The emitter of the transistor Q2A is connected to a resistor R7 which may have a resistance of 909 ohms, whereas the emitter of the transistor Q2B is connected to a resistor R18 which may have a resistance of 1.82 kilo-ohms. The resistors R7 and R18 are connected to the negative terminal of the 15-volt source. The base electrodes of the transistors Q2A and Q2B are connected together and to a grounded 0.1 microfarad capacitor C5. The base electrodes are also connected to the anode of a diode CR4 whose cathode is connected to the cathode of a Zener diode CR2, the anode of which is connected to the negative terminal of the 15-volt source.

The collector of the transistor Q1A is connected to a 1.82 kilo-ohm resistor R2 which, in turn, is connected to the positive terminal of the 15-volt source. The collector of the transistor Q1A is also connected to a grounded 0.1 microfarad capacitor C1. The collector of the transistor Q1B is connected to a 1 kilo-ohm resistor R3, and to the emitter of a PNP transistor Q4. The resistors R2 and R3 are connected to the positive terminal of the 15-volt source. The resistor R3 is shunted by a trimming resistor R8.

The base of the transistor Q1B is connected to the junction of a 602 ohm resistor R9 and of a 200 ohm grounded resistor R10. The resistor R10 is shunted by a trimming resistor R11. The resistor R9 is shunted by a variable capacitor C8 having a capacity of 3–10 picofarads. The other end of the resistor R9 is connected to the output terminal 402 of the circuit, and to a pair of 10 ohm resistors R12 and R13. The resistor R12 is connected to the emitter of a PNP transistor Q3, and the resistor R13 is connected to the emitter of a PNP transistor Q5. The collector of the transistor Q3 is connected through a 330 ohm resistor R14 to the positive terminal of the 15-volt source, and to a grounded 0.1 microfarad capacitor C4. The collector of the transistor Q5 is connected through a 330 ohm resistor R17 to the negative terminal of the 15-volt source, and to a grounded 0.1 microfarad capacitor C2.

The base of the transistor Q3 is connected to the collector of the transistor Q4, and the base of the transistor Q5 is connected through a 100 ohm resistor R16 to the collector of the transistor Q2B. The collectors of the transistors Q4 and Q2B are interconnected through a pair of diodes CR5 and CR6, and through a 22 ohm resistor R15. The base of the transistor Q4 is connected to a 0.1 microfarad grounded capacitor C3, and through a diode CR3 and Zener diode CR1 to the positive terminal of the 15-volt source. The base of the transistor Q4 is connected to the base of the transistor Q2B through a 1.5 kilo-ohm resistor R19.

As mentioned above, the scaling amplifier 20 of FIG. 6 responds to the voltage across the summing resistor R in FIG. 1 to provide an output voltage for the summing resistor R' which is exactly 4 times the input voltage, for scaling purposes. The amplifier circuit of FIG. 6 uses circuit elements with precise parameters, in order to obtain the multiplication factor with a high degree of accuracy.

Figure 7:
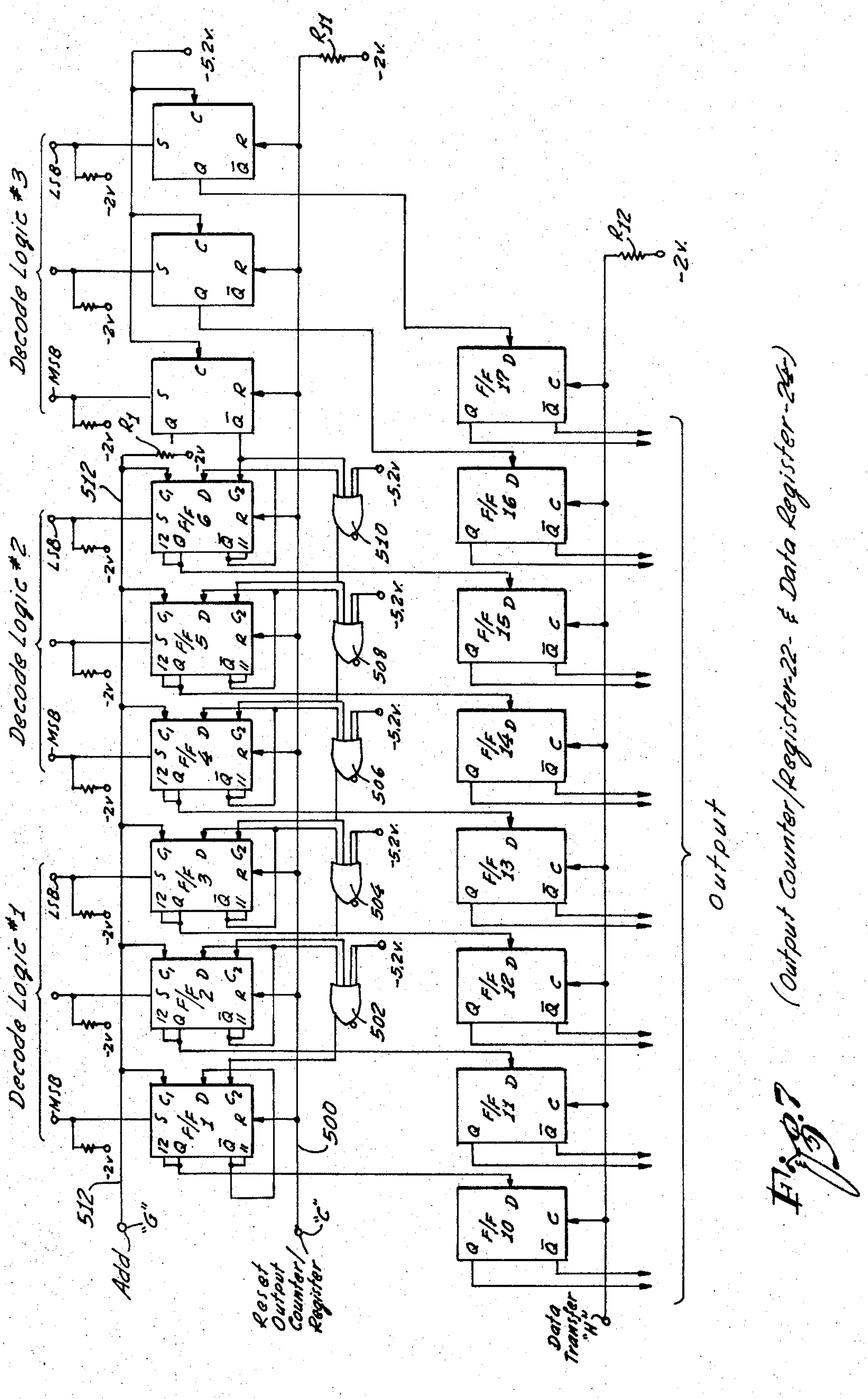
FIG. 7 is a logic diagram of an output counter/register and data register used in the system of FIG. 1.

The output counter/register 22 and data register 24 are shown in FIG. 7. The output counter/register 22 comprises a 9-bit register, as explained above, and is made up of nine flip-flops designated FF1–FF9. The flip-flops FF1–FF6 may be of the type presently marketed by the Motorola Company under their designation MC1234. The flip-flops FF7–FF9 may be of the type presently marketed by the Motorola Company under their designation MC1215.

The outputs from the analog/digital converter No. 1 are introduced to the flip-flops FF1, FF2 and FF3, with the most significant bit being introduced to the flip-flop FF1; and with the least significant bit being introduce to the flip-flop FF3. Likewise, the outputs from the analog/digital converter No. 2 are introduced to the flip-flops FF4–FF6, with the most significant bit being introduced to the flip-flop FF4, and with the least significant bit being introduced to the flip-flop FF6. The outputs from the analog/digital converter No. 3 are applied to the flip-flops FF7–FF9, with the most significant bit being introduced to the flip-flop FF7, and with the least significant bit being introduced to the flip-flop FF9.

All of the flip-flops FF1–FF9 are reset by the signal "C" introduced on the lead 500, the lead being terminated by a 50 ohm resistor R11 connected to the negative 2-volt source. The flip-flops are set whenever a binary "1" appears on the corresponding lead connecting the set input terminal of that flip-flop to the corresponding output of the analog/digital converters No. 1, No. 2 or No. 3. The flip-flops of the output counter/register 22 are interconnected through respective gates 502–510, as shown. These gates may be of the type marketed by the Motorola Company, and presently designated as MC1204. The output counter/register 22 undergoes its add function, when the "G" command is introduced from the timer 14 of FIG. 1 to a lead 512. The lead 512 is connected to the $C_1$ input terminal of each of the flip-flops FF1–FF6. The lead is terminated by a 50 ohm resistor R1 which is connected to the negative terminal of the −2volt source.

The 9-bit counter/register 22 operates in a manner described in the aforesaid patents, in that upon the receipt of the "add" command, the most significant bit of the binary coded output from the decode logic circuit No. 3, which is in flip-flop FF7, is added to the contents of the flip-flops FF1–FF6, so as to correct for analog errors in the conversions by the converters No. 1 and No. 2.

The two output terminals of the flip-flops FF1–FF6, FF8 and FF9 are connected to corresponding flip-flops FF10–FF17 which make up the data register 24. The data is transferred to the flip-flops of the data register 24 upon the introduction of the data transfer command "H" to a lead 516 which is connected to the C input terminal of each of the flip-flops FF10–FF17, and which is terminated in a 50 ohm resistor R12 connected to the negative terminal of the −2 volt source.

The invention provides, therefore, an improved high speed analog-to-digital converter which operates with a high degree of precision, and yet which is relatively inexpensive in its construction.

It will be appreciated that while a particular embodiment of the invention has been shown and described, modifications may be made. It is intended in the following claims to cover all modifications which come within the spirit and scope of the invention.

What is claimed is:

1. An analog-to-digital converter system including:
an input circuit for developing an analog input signal;
a first N-bit parallel analog/digital converter circuit having an input connected to said input circuit for digitizing said analog input signal in accordance with a thermometer code;
a first N-bit thermometer digital/analog converter circuit having an input connected to the output of said analog/digital converter circuit;
an output circuit;
thermometer-binary decode logic circuitry interposed between the output of said first analog/digital converter circuit and said output circuit;
a summing resistor connected to said input circuit and to the output of said first digital/analog converter circuit and serving to subtract from said analog input signal an analog signal proportional to the digitized output of said first analog/digital converter circuit;

a scaling amplifier connected to said summing resistor for multiplying the difference between the analog input signal and said proportional analog signal by a predetermined factor;

a second N-bit parallel thermometer analog/digital converter circuit having an input connected to said summing resistor for digitizing said difference signal;

a second N-bit thermometer digital/analog converter circuit having an input connected to the output of said second analog/digital converter circuit;

further thermometer decode logic circuitry intercoupling the output of said second N-bit parallel analog/digital converter to said output circuit; and a further summing resistor connected to the output of said amplifier and to the output of said second digital/analog converter, to cause said second summing resistor to subtract a discrete voltage, proportional to the encoded output of said second analog/digital converter, from the output of said scaling amplifier.

2. The analog-to-digital converter system defined in claim 1, in which said analog/digital converter circuit includes a plurality of comparators for digitizing said analog input signal, and in which said digital/analog converter circuit includes a plurality of current switches, the outputs of said comparators supplying digital output signals to said decode logic circuitry, and simultaneously driving corresponding ones of said current switches in said digital/analog circuit.

3. The analog/digital converter system defined in claim 2, in which the outputs of said current switches are applied to said summing resistor.

4. The analog/digital converter system defined in claim 1, and which includes a third N-bit parallel thermometer analog/digital converter circuit having an input connected to said second summing resistor; and further thermometer decode logic circuitry intercoupling the output of said third analog/digital converter circuit to said output circuit.

5. The analog/digital converter system defined in claim 4, in which said first, second and third analog/digital converter circuits have the same circuit composition, and in which said first and second thermometer digital/analog converter circuits have the same circuit configuration.

6. The system defined in claim 1, in which said output circuit includes a counter register, and an output data register coupled to said counter register.

* * * * *